US006819027B2

(12) United States Patent
Saraf

(10) Patent No.: US 6,819,027 B2
(45) Date of Patent: Nov. 16, 2004

(54) METHOD AND APPARATUS FOR CONTROLLING ULTRASONIC TRANSDUCER

(75) Inventor: Shailendhar Saraf, San Jose, CA (US)

(73) Assignee: Cepheid, Sunnyvale, CA (US)

( * ) Notice: Subject to any disclaimer, the term of this patent is extended or adjusted under 35 U.S.C. 154(b) by 99 days.

(21) Appl. No.: 10/091,693

(22) Filed: Mar. 4, 2002

(65) Prior Publication Data

US 2003/0164658 A1 Sep. 4, 2003

(51) Int. Cl.[7] .......................... H01L 41/08

(52) U.S. Cl. .......................... 310/316.01

(58) Field of Search .......................... 310/311, 317, 310/316.01, 316.02, 319

(56) References Cited

U.S. PATENT DOCUMENTS 4,160,971 A * 7/1979 Jones et al. ............ 340/870.26
4,275,363 A * 6/1981 Mishiro et al. ................ 331/4
4,277,710 A 7/1981 Harwood et al.
4,311,922 A 1/1982 Puckette
4,403,176 A 9/1983 Cranston
4,445,063 A 4/1984 Smith
4,525,790 A 7/1985 Nakamura
4,577,500 A * 3/1986 Mishiro ....................... 73/579
4,635,483 A * 1/1987 Mishiro ....................... 73/579
4,703,213 A 10/1987 GaHerbert
4,816,743 A 3/1989 Harms et al.
4,888,565 A 12/1989 Littleford et al.
4,954,960 A 9/1990 Lo et al.
4,965,532 A 10/1990 Sakurai
4,970,656 A 11/1990 Lo et al.
4,973,876 A 11/1990 Roberts
4,983,523 A 1/1991 Li et al.
5,001,649 A 3/1991 Lo et al.
5,113,116 A * 5/1992 Wilson .................. 310/316.01
5,184,605 A 2/1993 Grzeszykowski
5,216,338 A * 6/1993 Wilson ....................... 318/116
5,370,602 A 12/1994 Kepley
5,373,212 A 12/1994 Beau
5,374,522 A 12/1994 Murphy et al.
5,374,533 A 12/1994 Matsuzawa et al.
5,394,047 A 2/1995 Scharlack et al.
5,406,503 A 4/1995 Williams, Jr. et al.
5,425,704 A * 6/1995 Sakurai et al. ................ 604/22
5,431,664 A 7/1995 Ureche et al.
5,447,509 A 9/1995 Mills et al.
5,472,079 A 12/1995 Yagi et al.
5,635,619 A 6/1997 Upda et al.
5,637,947 A 6/1997 Kising et al.
5,639,423 A 6/1997 Northrup et al.
5,646,039 A 7/1997 Northrup et al.
5,652,141 A 7/1997 Henco et al.
5,707,860 A 1/1998 Collis et al.
5,735,280 A 4/1998 Sherman et al.
5,777,860 A 7/1998 Halbert
5,840,878 A 11/1998 Collis et al.
5,856,174 A 1/1999 Lipshutz et al.
5,874,046 A 2/1999 Megerle (List continued on next page.)

*Primary Examiner*—Mark Budd
(74) *Attorney, Agent, or Firm*—Townsend & Townsend & Crew LLP

(57) ABSTRACT

Method and apparatus for implementing ultrasonic systems that maximize efficiency by dynamically detecting and maintaining peak operational resonance frequency. In one embodiment, the invention dynamically sweeps the output frequency range to locate the peak load current. The resonance frequency corresponding to the peak load current is used as a reference frequency in a control loop. The control loop includes a voltage-controlled oscillator (VCO) that is controlled by a loop controller and operates to lock onto the dynamically sensed reference frequency. In response to the VCO output, a pulse-width modulator (PWM) circuit drives a pair of switches that adjust transducer current to maintain the circuit locked on the resonance frequency at a substantially constant current.

25 Claims, 7 Drawing Sheets

U.S. PATENT DOCUMENTS

| | | | | |
|---|---|---|---|---|
| 5,880,580 | A | | 3/1999 | Johansen |
| 5,892,315 | A | | 4/1999 | Gipson et al. |
| 5,895,997 | A | | 4/1999 | Puskas et al. |
| 5,897,569 | A | | 4/1999 | Kellogg et al. |
| 5,900,690 | A | | 5/1999 | Gipson et al. |
| 5,942,425 | A | | 8/1999 | Walters et al. |
| 5,962,310 | A | | 10/1999 | Collis et al. |
| 8,071,480 | | | 8/2000 | Halaka |
| 8,100,084 | | | 8/2000 | Miles et al. |
| 6,188,186 | B1 | | 2/2001 | Kong et al. |
| 6,537,291 | B2 | * | 3/2003 | Friedman et al. ........... 606/169 |

* cited by examiner

METHOD AND APPARATUS FOR CONTROLLING ULTRASONIC TRANSDUCER

BACKGROUND OF THE INVENTION

The present invention relates in general to ultrasonic systems, and in particular to methods and circuitry for driving an ultrasonic transducer.

Ultrasound technology is utilized in a variety of applications from machining and cleaning of jewelry crystals to performing surgical operations involving for example clearing obstructed blood vessels, to disrupting or lysing cells in order to release the inracellular contents (e.g., nucleic acid). The basic concept of ultrasonic systems involves the conversion of high frequency electric energy into ultrasonic frequency mechanical vibrations using transducer elements. Such systems typically include a driver circuit that generates electrical signals which excite a piezoelectric transducer assembly. A transmission element such as a probe connects to the transducer assembly and is used to deliver mechanical energy to the target.

For a given user-defined parameter (e.g., amplitude level) there is a resonance frequency at which the driver circuit operates most efficiently. The driver circuit is thus designed to operate at resonance frequency for a particular application. In many applications, however, due to changes in the environmental conditions the optimal resonance frequency drifts as the mechanical energy is being delivered. Such varying environmental conditions may include, for example, changes in temperature or the consistency of the target itself. The challenge, therefore, is to design an ultrasonic system that adapts to such environmental variations such that the driver circuit operates at its optimal resonance frequency at all times.

BRIEF SUMMARY OF THE INVENTION

The present invention provides methods and apparatus for implementing an ultrasonic system that dynamically detects and maintains peak operational resonance frequency. In one embodiment, the invention dynamically sweeps the output frequency range to locate the peak load current. The resonance frequency corresponding to the peak load current is used as a reference frequency in a control loop such as a phase-locked loop (PLL). The control loop includes a voltage-controlled oscillator (VCO) that is controlled by a loop controller such as a microprocessor and operates to lock onto the dynamically sensed reference frequency. In response to the VCO output, a pulse-width modulator (PWM) circuit drives a pair of switches that adjust transducer current to maintain the circuit locked on the resonance frequency at a substantially constant current. By combining the frequency sweeping feature that locates the peak load current and the resonance frequency, with the microprocessor controlled pulse width modulated current switches, the invention provides for an ultrasonic system that maintains a substantially constant displacement of the transmission element with maximum efficiency. The invention further provides an algorithm that allows the user to specify parameters such as amplitude level of the driver, and then performs a multi-step frequency sweep to drive the transducer in one of several modes including constant current drive, constant voltage drive and constant power drive. In various specific embodiments, the invention provides additional features such as optional circuit alarm and VCO linearity compensation.

Accordingly, in one embodiment, the present invention provides an ultrasonic system including: a transducer coupled to a secondary of a transformer; and a control loop coupled between the transducer and a primary of the transformer, wherein the control loop includes a current sense circuit coupled to the transformer and configured to detect load current; a loop controller coupled to the current sense circuit and configured to dynamically set a loop reference frequency in response to the sensed load current; a voltage-controlled oscillator (VCO) coupled to the controller and configured to generate an output signal oscillating at the reference frequency; and a pulse-width modulator coupled to the VCO and configured to control an amount of current in the primary of the transformer.

In another embodiment, the present invention provides a driver circuit for an ultrasonic transducer, wherein the driver circuit includes: a current sense circuit coupled to detect a transducer load current; a controller coupled to the current sense circuit and configured to set a reference frequency corresponding to peak resonance frequency; a voltage-controlled oscillator (VCO) coupled to the controller and configured to generate an output signal oscillating at the reference frequency; and a pulse width modulator coupled to the VCO and configured to modulate an output current of the driver circuit. The pulse width modulator includes a first switch and a second switch whose operation is controlled by pulse width modulated signals generated in response to the VCO output signal.

In yet another embodiment, the present invention provides a method for driving an ultrasonic transducer, wherein the method includes (a) sweeping a frequency range of the output to locate a peak load current; (b) defining a reference frequency as the frequency corresponding to the peak current; (c) adjusting an oscillation frequency of an oscillator to the reference frequency; (d) controlling output transistor switches by pulse width modulated signals generated in response to the oscillator output to adjust transducer current; and (e) periodically repeating steps (a) through (d) to dynamically adjust the reference frequency that controls the transducer current.

The following detailed description and the accompanying drawings provide a better understanding of the nature and advantages of the present invention.

DETAILED DESCRIPTION OF THE INVENTION

Figure 1:
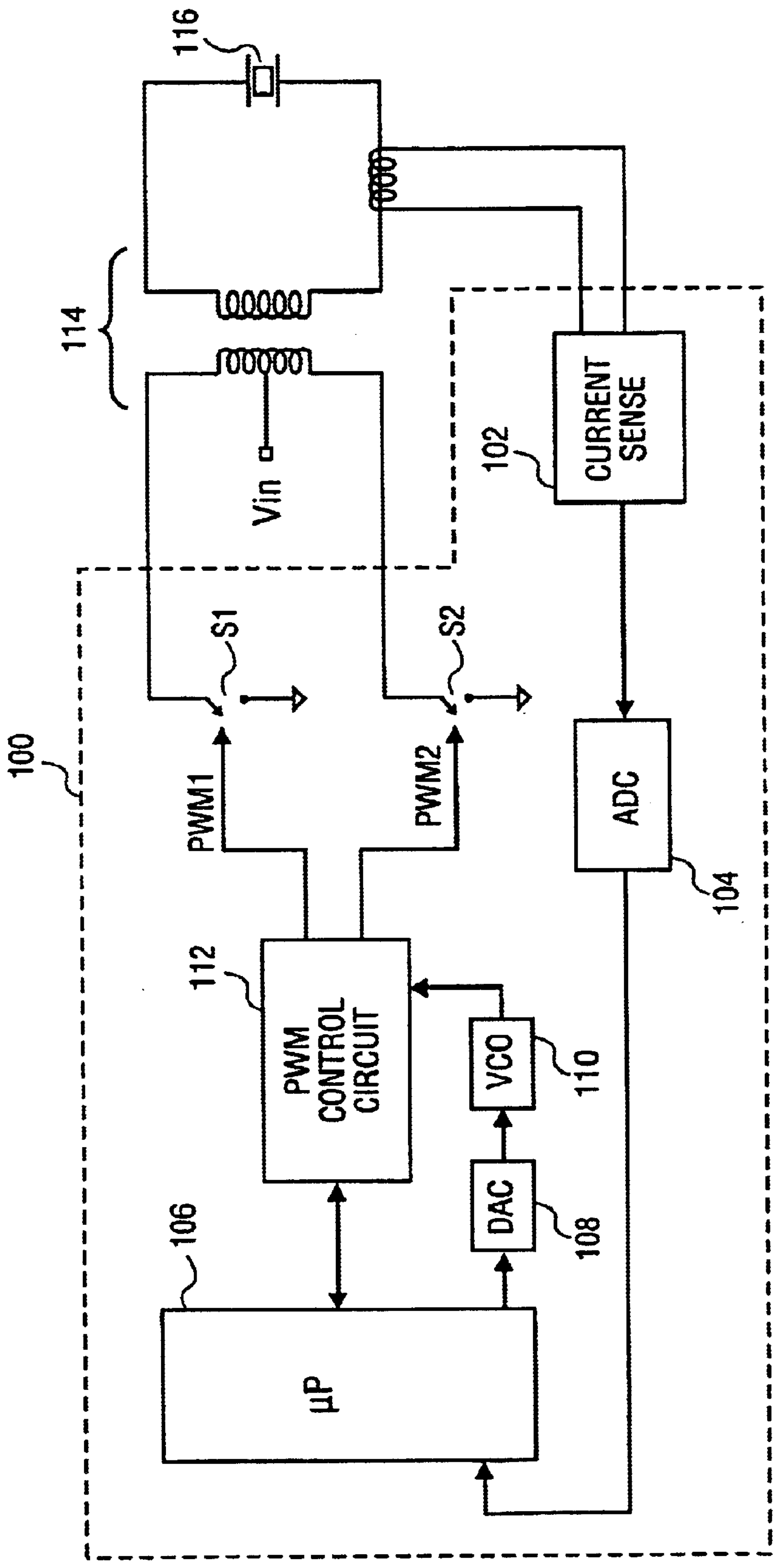
FIG. 1 is a simplified block diagram of a driver circuit for an ultrasonic system according to one embodiment of the invention.

Referring to FIG. 1, there is shown a simplified block diagram of a driver circuit 100 for an ultrasonic transducer according to one embodiment of the invention. Driver circuit 100 includes a current sense block 102 that is magnetically coupled to the load. Current sense block 102 detects the load current and generates an analog signal representative of the amplitude of the load current. The analog current sense signal is converted to a digital signal by an analog-to-digital converter or ADC 104. The output of ADC 104 is supplied to a controller or microprocessor 106. Microprocessor 106 uses the digital signal to determine the peak resonance frequency and sends a digital signal corresponding to the resonance frequency to a digital-to-analog converter DAC 108. DAC 108 converts this signal into an analog voltage signal that controls the oscillation frequency of a voltage-controlled oscillator (VCO) 110. The output of VCO 110 connects to a pulse-width modulator (PWM) control circuit 112 that generates pulse signals PWM1 and PWM2 at the desired frequency. Signals PWM1 and PWM2 drive switches S1 and S2 that in turn control the amount of current being delivered to the transducer.

Figure 2:
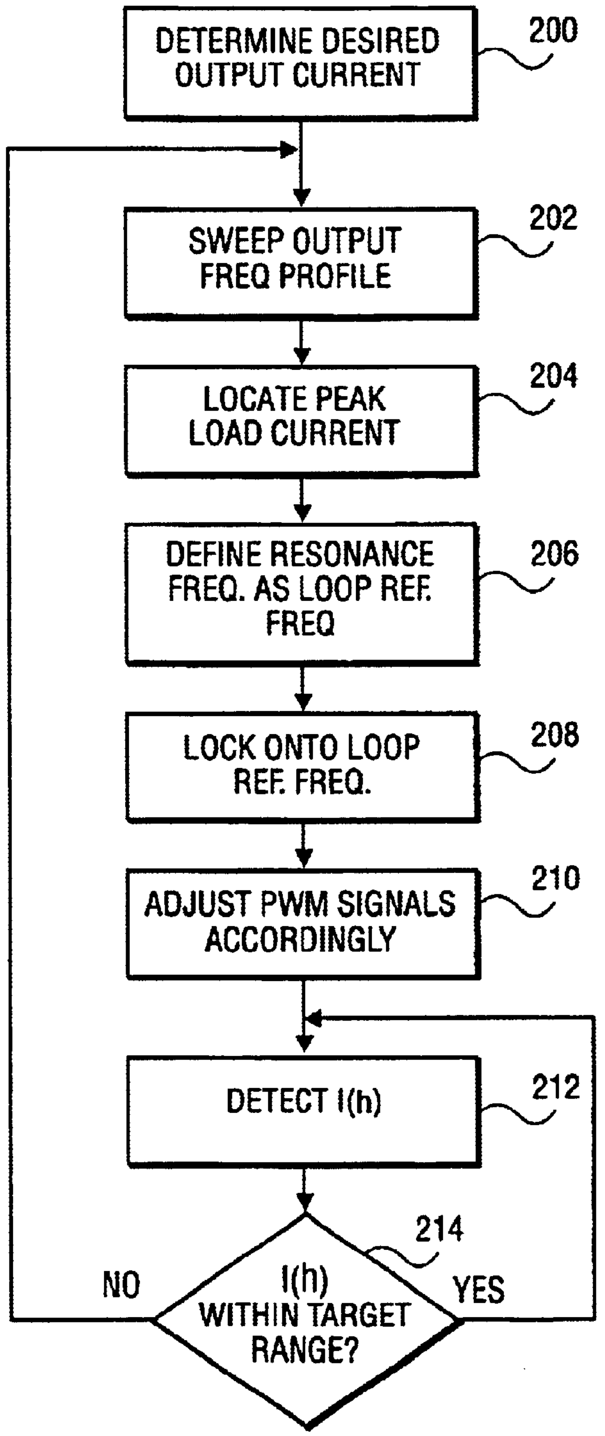
FIG. 2 is a flow diagram illustrating the method of operating an ultrasonic system according to one embodiment of the invention.

The operation of the driver circuit according to one exemplary embodiment of the invention will be described in connection with the broad and simplified flow diagram of FIG. 2. In a typical application, the user specifies an amplitude level and a time duration for the operation of the ultrasonic device. Software stored in microprocessor 106 translates the amplitude level into a desired current level I(h) for the transduce. Referring to FIG. 2, at step 200 the microprocessor determines the desired transducer current level I(h) based on user specified amplitude level. This is followed by a frequency profile sweep (step 202) to locate the peak load current (step 204). Current sense block 102 detects the peak current and supplies this information to microprocessor 106 via ADC 104. Microprocessor 106 uses this information to determine the peak resonance frequency. This resonance frequency is used as the control loop reference frequency (step 206). Microprocessor 106 adjusts the frequency of operation of VCO 110 via DAC 108 such that it locks to the reference frequency (step 208). PWM control circuit 112 then receives the output of VCO 110 and generates signals PWM1 and PWM2 (step 210). PWM control circuit 112 divides the VCO output signal into two alternating non-overlapping signals by taking one signal from the rising edge of the VCO output and a second signal from the falling edge of the VCO output.

Figure 3:
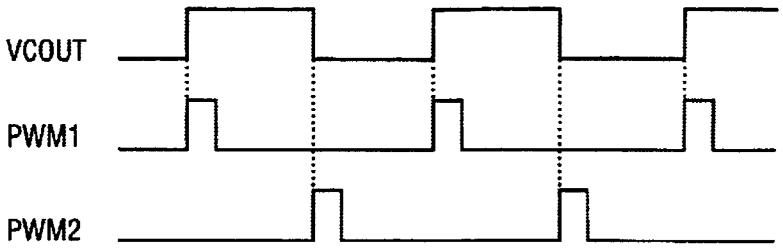
FIG. 3 shows waveforms that illustrate the operation of the pulse-width modulated signals.

FIG. 3 shows signal waveforms for PWM1 and PWM2 that are generated from a VCO output signal having an exemplary frequency of 36 kHz. Signals PWM1 and PWM2 control switches S1 and S2 that in turn control the amount of current being pulled from transformer 114 which has a voltage input Vin at its center tap. The secondary of transformer 114 drives the resonating crystal 116. The transducer current I(h) is periodically detected (step 212) and compared against the target value. If the measured current drifts outside a preset range around the target value, the PWM signals are adjusted by repeating steps 202 to 210. Thus, the system remains locked at resonance frequency on the specified current and deviates only within the specified range.

Figure 4:
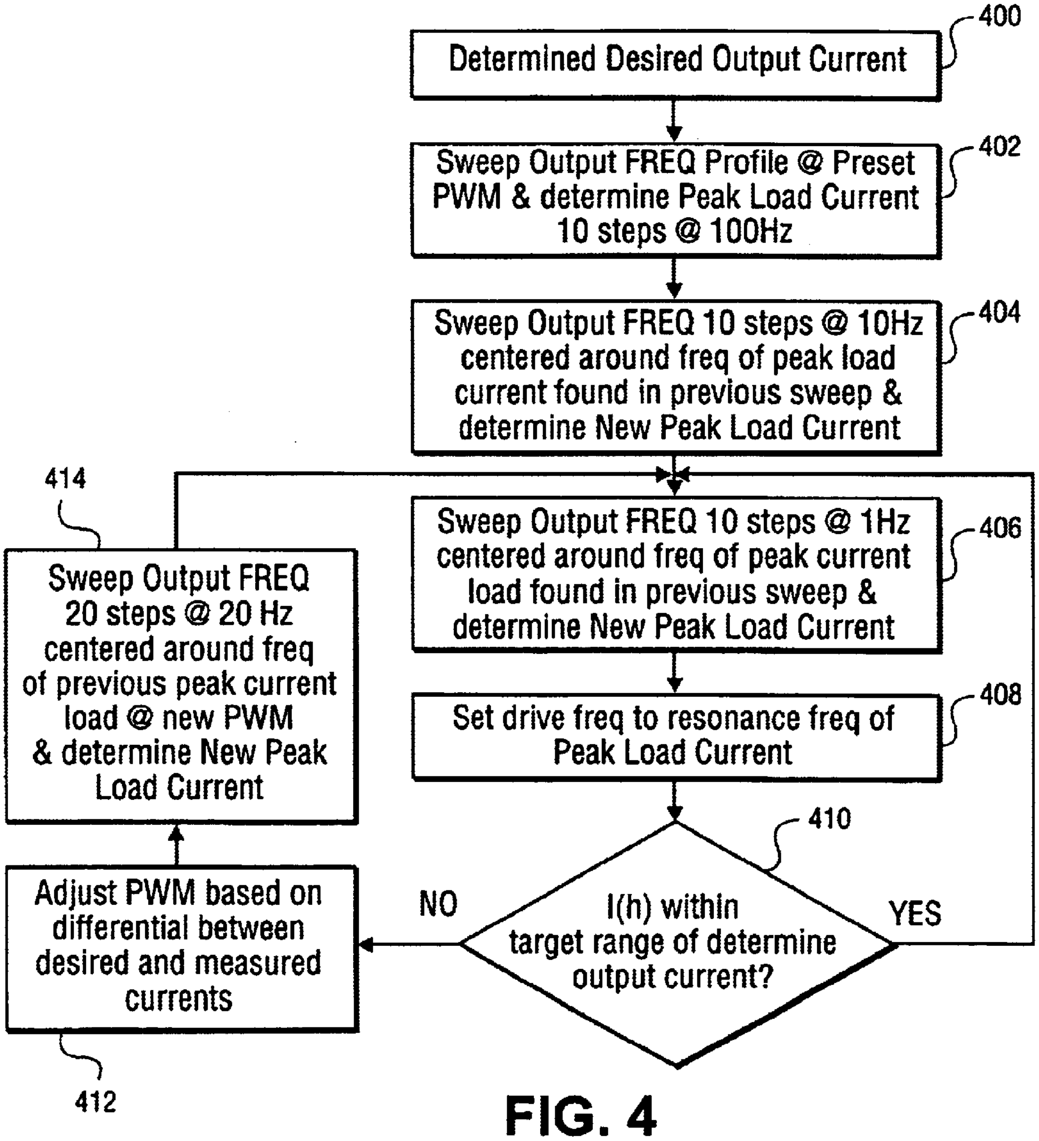
FIG. 4 is a flow diagram illustrating an exemplary algorithm used by the ultrasonic driver of the present invention to detect the peak load current.

The frequency profile sweep, according to one embodiment of the invention, occurs in multiple steps with increasing granularity to locate the peak current with a high degree of precision. The flow diagram of FIG. 4 depicts an alternative embodiment of the present invention which employs an exemplary multi-step sweeping technique. According to this alternative embodiment, after determining the desired output current (step 400), the process includes an initial broad sweep (step 402) of the output frequency profile involving, for example, ten 100 Hz frequency steps to locate the approximate position f1 of the peak current. This is followed by a second medium sweep (step 404) involving, for example, ten 10 Hz frequency steps centered around f1, five steps to the left and five steps to the right. A more accurate location f2 for the peak current is obtained by the second sweep. A final narrow sweep is then performed (step 406) using, for example, ten 1 Hz steps centered around f2. The final sweep yields a highly precise location f3 for the peak current. The resonance frequency f3 is then used to set the driver frequency (step 408), after which the transducer current I(h) is measured (step 410). In this embodiment, the final narrow sweep (step 406) is repeated periodically as long as I(h) remains within the target range. When I(h) falls outside of the target range, the PWM signals are adjusted based on the differential (step 412), and a new frequency sweep (step 414) is performed with the adjusted PWM signals before the loop is repeated. The new sweep at step 414 can be performed in, e.g., 20 steps at 20 Hz centered around f3 to determine a new and more accurate resonance frequency. Note that the final narrow sweep (step 406) can be repeated as many times as necessary to keep the circuit locked on to the resonance frequency at the desired target current at all time. For example, in one embodiment, the final sweep is repeated every few milliseconds.

In a specific embodiment, the present invention provides an algorithm that enables the user to drive the circuit in three different modes. The first mode is the constant current drive described above. In this mode, once the circuit locks onto the resonance frequency, a software routine checks the digital current reading to determine if it matches the user's specifications within a preset range. If the current reading falls outside the preset range, the controller initiates another frequency sweep of, for example, 20 steps at 20 Hz per step, and adjusts the PWM signals accordingly. It will then check the digital current reading once again to determine if it matches the user's specification. In this manner, the system maintains lock on the specified current and deviates only within a narrow preset range. Using the process described above in connection with FIG. 4, both the lock on resonance frequency and the lock on constant current level can be simultaneously and continuously monitored.

A second mode of operation allows for a constant voltage drive. In this mode, the circuit drives the transducer at a fixed voltage set by a constant pulse width modulation. The microprocessor sets the PWM to the user's specification and performs the multi-step frequency profile sweep to lock on to the resonance frequency. The constant voltage drive mode fixes the PWM to a given value and therefore allows the current to drift up or down.

The third mode of operation is constant power driver. The voltage applied to the load is a function of PWM that is controlled by the microprocessor. In this mode, the microprocessor adjusts the current such that the product of voltage across the load and the current is kept constant.

Figure 5:
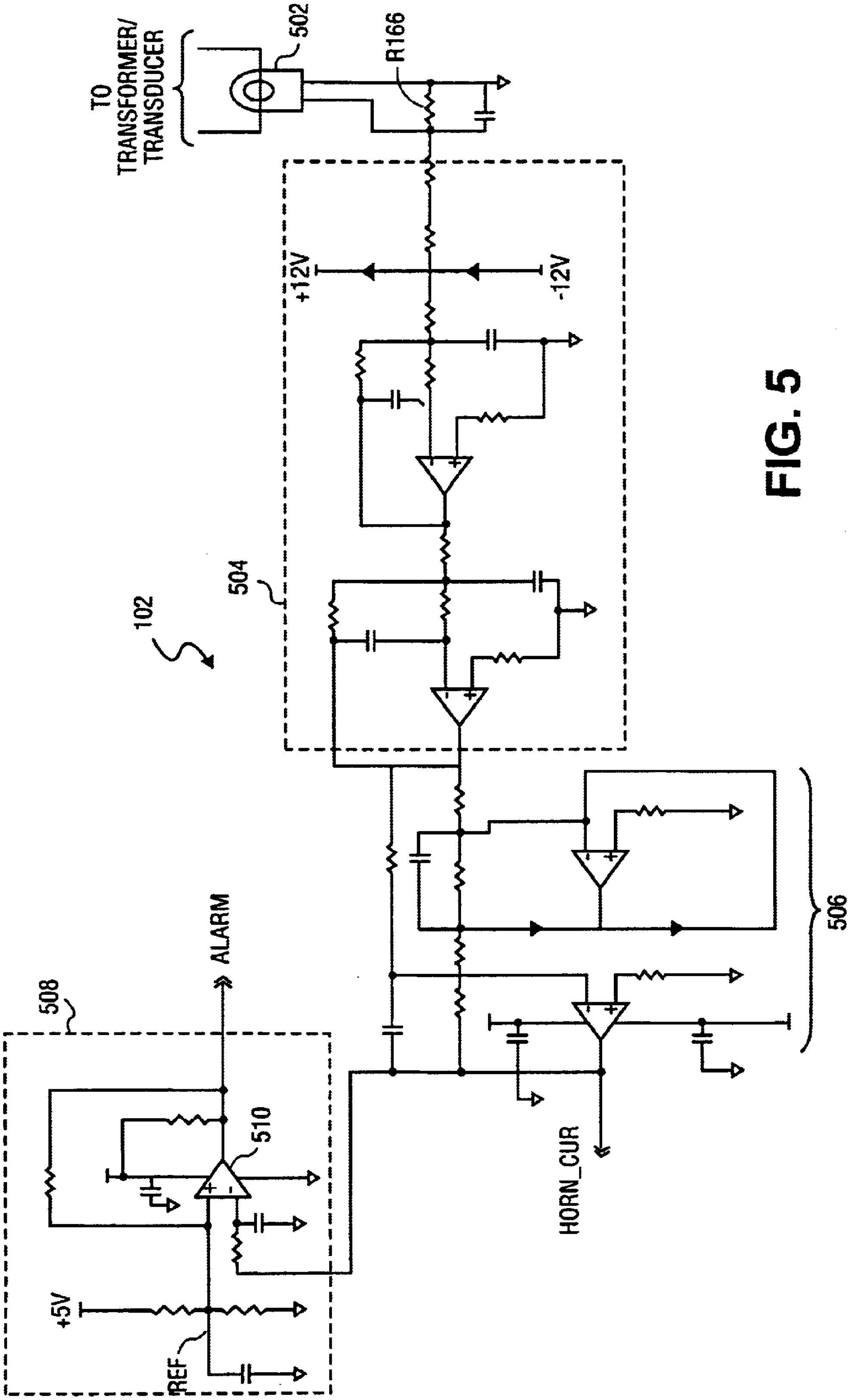
FIG. 5 shows an exemplary implementation for a current sense circuit used in the driver circuit of the present invention.

A specific implementation of the ultrasonic driver circuit according to an exemplary embodiment of the invention will be described in connection with FIGS. 5–7. Referring to FIG. 5, there is shown one embodiment of the current sense block 102. A current transformer 502 magnetically couples the current sense circuit to the transducer (not shown in FIG. 4). A sense resistor R166 connects across the terminals of current transformer 502 such that the signal developing across resistor R166 represents the magnitude of the transducer current I(h). This signal goes through a filter 504 and then a DC rectifier 506. Filter 504 is a low pass filter that is designed to amplify the signal and remove additional harmonics. In the exemplary embodiment shown filter 504 is implemented by a fourth order active low pass (butterworth) filter. Rectifier 506 is a full-wave rectifier that converts the signal into a DC value HORN_CUR that is then sent to the analog-to-digital converter (ADC 104 in FIG. 1). An alarm circuit 508 can be optionally added to protect the circuit against accidental power surge or other related failures. Alarm circuit 508 includes a comparator 510 that compares the transducer current HORN_CUR to a preset threshold or reference signal REF. If the transducer current HORN_CUR exceeds the threshold value, alarm circuit 508 generates a fault_alarm signal that is supplied to the microprocessor. The microprocessor in turn shots off the PWM circuitry to prevent any damage to the circuit board or the resonating crystal.

Figure 6:
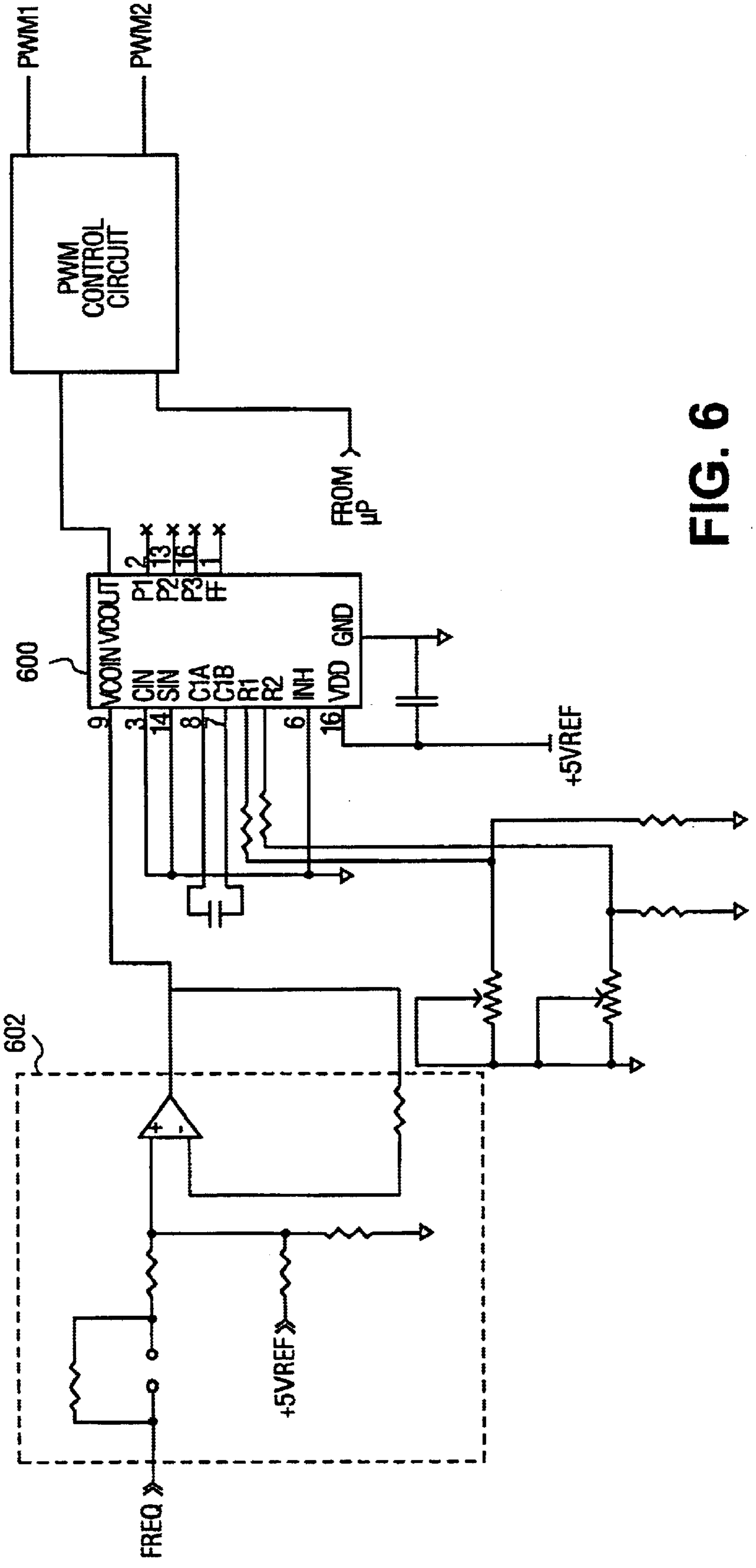
FIG. 6 shows an exemplary implementation for a voltage-controlled oscillator used in the driver circuit of the present invention.

FIG. 6 is a partial schematic of an exemplary implementation for the voltage-controlled oscillator of the present invention. There a number of different known implementations for a VCO. In this embodiment, a 74HCT4046 chip 600 is used which has a frequency range determined by a voltage input at VCOIN from 0 to 5V. VCO chip 600, however, has a limited linear frequency range of e.g., 2.7V. To compensate for this problem, this specific embodiment of the invention includes a linearity compensation circuit 602 that receives the signal FREQ from the microprocessor and operates to extend the linear range of the VCO to almost the entire 5V range. Variable resistors R151 and R152 are used tune the lower frequency range and the overall frequency range, respectively. The output of VCO 600, signal VCOUT is applied to PWM control circuit (112 in FIG. 1) to generate signals PWM1 and PWM2. In one embodiment, PWM control circuit 112 is implemented using a programmable logic device.

Figure 7:
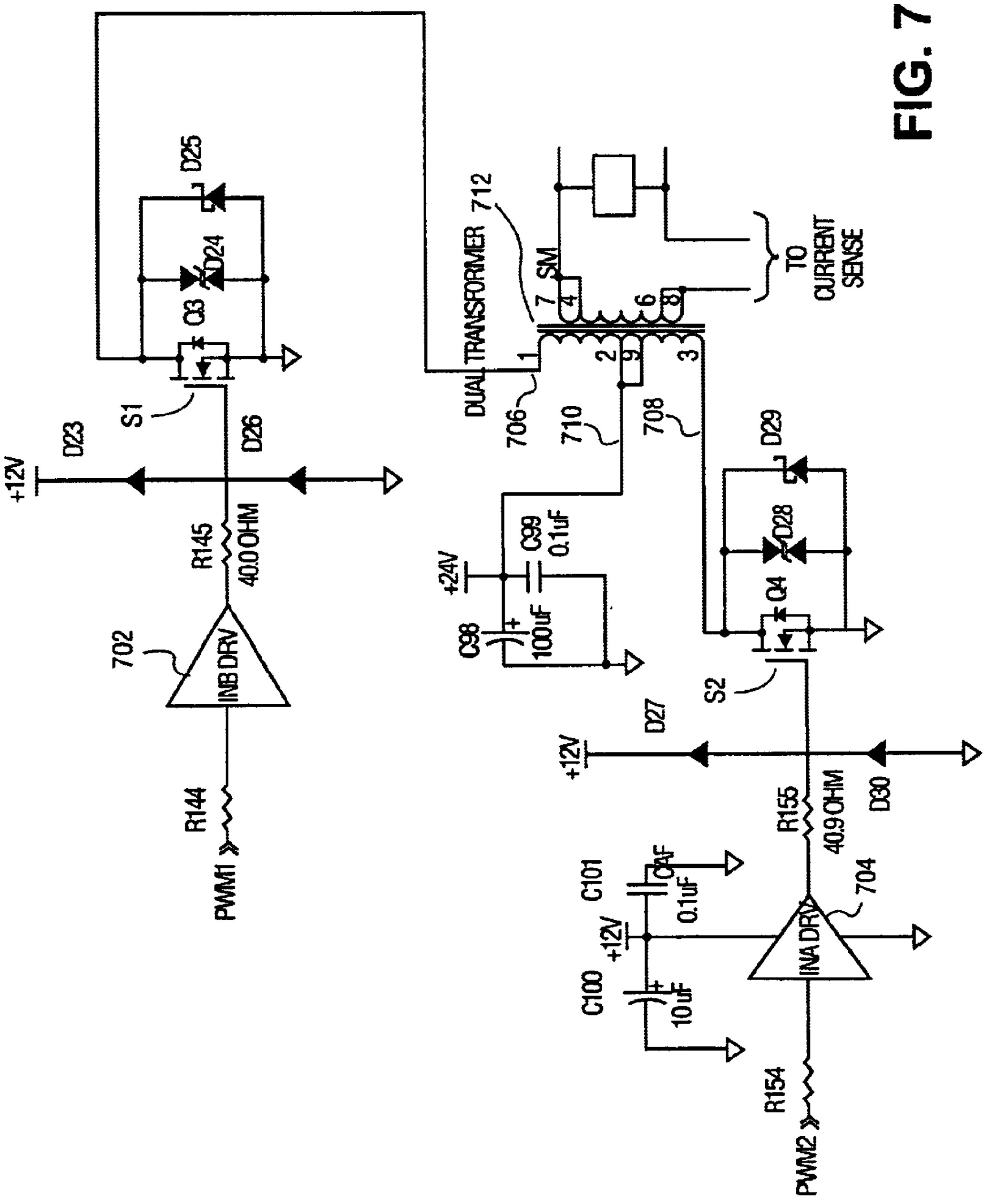
FIG. 7 shows an exemplary implementation for pulse-width modulated switches that control the amount of current being delivered to the transducer according to the present invention.

FIG. 7 provides a more detailed circuit schematic of an illustrative implementation of the PWM switches that drive the transducer. In this exemplary implementation, each of the signals PWM1 and PWM2 are first applied to a driver amplifier 702 and 704, respectively. Switches S1 and S2 are implemented by n-type metal-oxide-semiconductor filed effect transistor (MOSFETs) where drivers 702 and 704 drive the gate terminals of S1 and S2, respectively. MOSFET S1 has one current-conducting (drain) terminal connected to a first node 706 of the primary of a dual transformer 712, and its second current-conducting (source) terminal connected to ground. MOSFET S2 has one current-conducting (drain) terminal connected to a second node 706 of the primary of dual transformer 712, and its second current-conducting (source) terminal connected to ground. As thus constructed, the circuit results in a class D push-pull power amplifier. It is to be understood, however, that other amplifier topologies such as class C and E can also be employed for high efficiency. The center tap (node 710) of the primary of dual transformer 712 is connected to a voltage input having a voltage of, e.g., 24V. The secondary of transformer 712 connects to the transducer. The voltage input of the transformer center tap can vary depending on the application. To improve the performance of MOSFETs S1 and S2 as switches, transient voltage suppressors and Schottky diodes are added to each one.

The advantages of the ultrasonic system of the present invention make it particularly well suited for certain applications. For example, in the fields of molecular biology and biomedical diagnostics, it is often necessary to extract nucleic acid from cells or viruses. Once released from the cells, the nucleic acid may be used for genetic analysis such as sequencing, pathogen identification and quantification, and the like. The extraction of nucleic acids from cells or viruses is generally performed by physical or chemical methods. While known methods for disrupting cells or viruses have had some measure of success, most suffer from certain drawbacks and disadvantages including those involving ultrasonic agitation. Typical problems with existing ultrasonic lysis of cells include non-uniform distribution of ultrasonic energy, slow lysing process, physical damage over time to sample container, non-portability of the system, etc.

Figure 8:
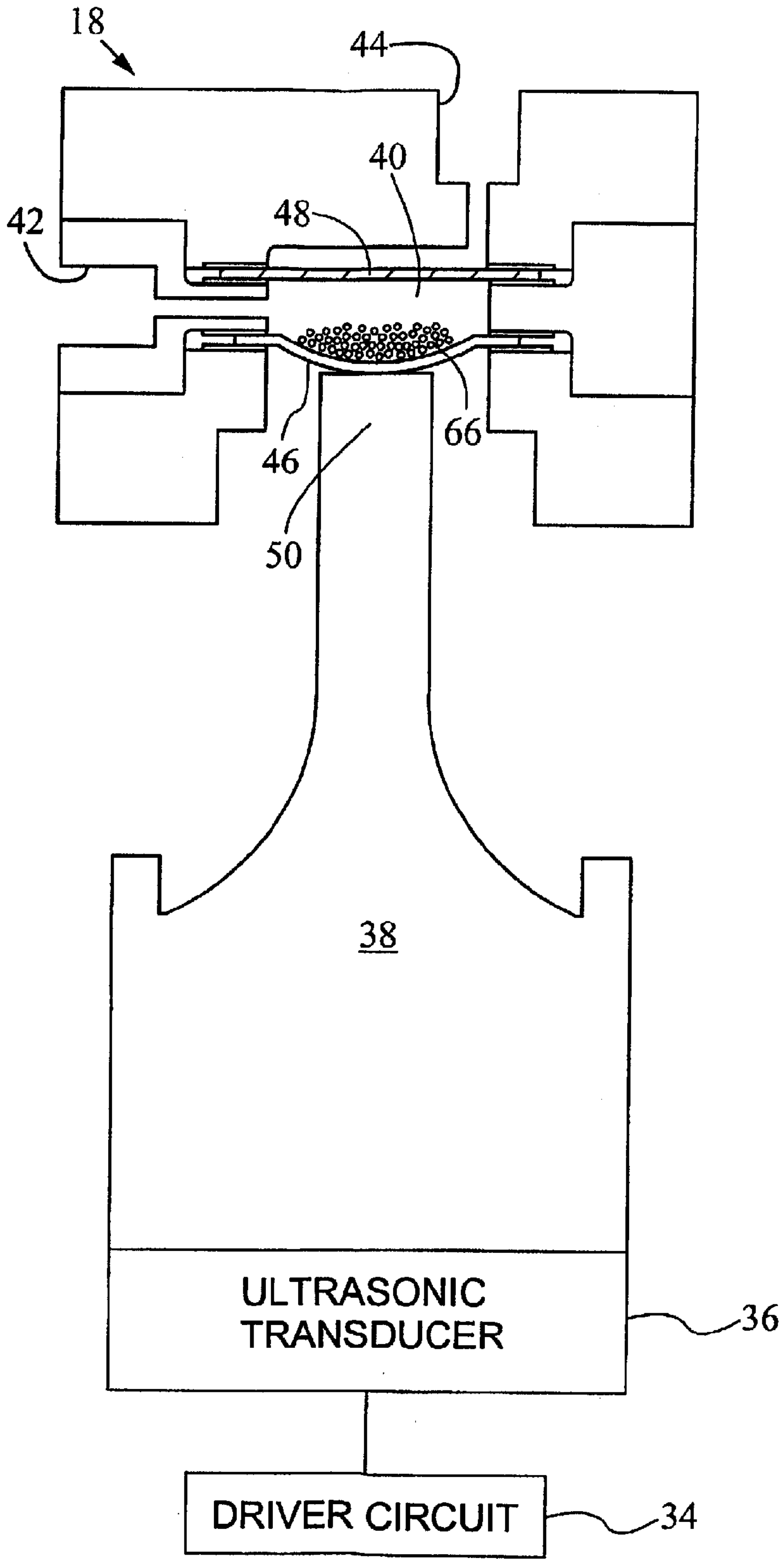
FIG. 8 is a cross sectional view of an apparatus including an ultrasonic transducer according to the present invention that is used for disrupting cells or viruses.

In another embodiment, the present invention employs the ultrasonic system of the present invention to provide an improved apparatus and method for disrupting cells or viruses to release the nucleic acid therefrom. The invention, according to this embodiment, provides for rapid, non-invasive lysis of cells or viruses held in a container by applying a vibrating surface of a transducer device to a wall of the container without melting, cracking, or otherwise damaging the wall of the container. FIG. 8 shows a cross sectional view of an apparatus including an ultrasonic transducer 36 and horn 38 that is used for lysing cells or viruses. The apparatus includes a container 18 having a chamber 40 for holding a liquid containing the cells or viruses. The chamber 40 has a wall 46 for contacting the vibrating tip 50 of the horn 38. The wall 46 thus provides an interface between the transducer/horn assembly and the contents of the chamber 40. In the exemplary embodiment shown in FIG. 8, the wall 46 is dome-shaped and convex. In alternative embodiments, the interface wall 46 may have other forms, such as a flat wall, a wall with stiffening ribs, or a wall comprising a flexible plastic film. The wall 46 is preferably sufficiently elastic to deflect in response to vibratory movements of the horn tip 50. The transducer 36 is driven by a driver circuit 34 as previously described with reference to FIG. 1 to operate at the optimum frequency. The vibration of the transducer/horn assembly deflects the wall 46 to generate pressure waves or pressure pulses in the chamber 40 to effect lysis of the cells or viruses in the chamber. Optionally, the chamber 40 may contain beads 66 that are agitated by the sonication of the chamber 40. The beads move violently in response to the pressure waves or pressure pulses in the chamber 40 to rupture the cells or viruses. The chamber 40 may also optionally include a filter 48 for trapping cellular debris as the lysate is forced to flow out the outlet port 44 of the container 18. The transducer/horn assembly may be coupled to the container 18 using any suitable holding mechanism, and in particularly preferred embodiments, the transducer/horn assembly is biased against the interface wall 46 using an elastic body (e.g., one or more springs or compressed air).

Many modifications to the lysis apparatus shown in FIG. 8 are possible. For example, the ultrasonic transducer may be directly coupled to the chamber wall 46, so that the horn 38 is eliminated. In one alternative embodiment, the transducer comprises piezoelectric material (e.g., a piezoelectric stack made of layers of piezoelectric material) that is directly coupled to the chamber wall 46. The piezoelectric material is driven by the driver circuit 34 causing the piezoelectric material to vibrate at a suitable frequency and amplitude to sonicate the chamber 40 and lyse the cells or viruses therein. In an alternative embodiment, the piezoelectric transducer includes a top layer of material (e.g., sheet metal or mylar) that is placed in contact with the external surface of the chamber wall 46. The top layer of material thus couples the piezoelectric material to the wall 46 and provides the vibrating surface for deflecting the wall. A more detailed description of the various systems and methods for lysing of cells or viruses according to the ultrasonic lysis embodiments of the present invention can be found in commonly assigned patent applications PCT/US00/14740 filed May 30, 2000 and published as WO 00/73413 Dec. 7, 2000, and U.S. Ser. No. 09/972,221 filed Oct. 4, 2001 entitled "Apparatus and Method for Rapid Disruption of Cells or Viruses", both of which patent applications are hereby incorporated by reference in their entirety.

It is to be understood that the specific embodiments described above are for illustrative purposes only, and that various modifications, alternative implementations and equivalents are possible. For example, the various functional blocks shown in the block diagram of FIG. 1 could be integrated in different combinations. Some of the functionality described could be implemented in software or hardware, or a modified combination thereof. Furthermore, specific numerical values given for frequencies of operation and voltage levels are for illustrative purposes only, and different applications may require different frequency ranges and current and voltage levels. Similarly, many different variations and equivalents are possible for the specific circuit implementations shown in FIGS. 5–7. For example, switches S1 and S2 may be implemented by different types of transistors including for example, p-type MOSFETs, bipolar junction transistors, and the like. The scope of the invention should therefore not be limited to the embodiments described above, and should instead be determined by the following claims and their full breadth of equivalents.

What is claimed is:

1. A driver circuit for an ultrasonic transducer, comprising:

- a current sense circuit coupled to detect a transducer load current;
- a controller coupled to the current sense circuit and configured to perform a frequency sweep of a driver output to locate a resonance frequency corresponding to peak current;
- a voltage-controlled oscillator (VCO) coupled to the controller and configured to generate an output signal oscillating at the resonance frequency;
- a pulse width modulator coupled to the VCO and configured to modulate an output current of the driver circuit;
- a first switch and a second switch coupled to the pulse width modulator and configured to switch an amount of the output current in response to the VCO output signal; and
- an analog-to-digital converter coupled between the current sense circuit and the controller, and configured to convert an analog output signal of the current sense circuit into a digital signal.

2. The driver circuit of claim 1 further comprising a digital-to-analog converter coupled between the controller and the VCO, and configured to convert a digital controller output signal to an analog voltage signal.

3. The driver circuit of claim 1 wherein the current sense circuit comprise:

- a current sense resistive element magnetically coupled to the transducer;
- a low pass filter coupled to the current sense resistive element; and
- a full-wave rectifier coupled to the low pass filter and configured to generate a DC signal representing the transducer load current.

4. The driver circuit of claim 3 further comprising a current transformer coupled between the current sense resistive element and a magnetic coil.

5. The driver circuit of claim 3 wherein the low pass filter comprises a fourth order active filter.

6. The driver circuit of claim 1 further comprising an alarm circuit coupled between the current sense circuit and the controller, and configured to disable the pulse width modulator when the load current reaches a predetermined threshold.

7. The driver circuit of claim 6 wherein the alarm circuit comprises a comparator having a first input coupled to an output of the current sense circuit and a second input coupled to a reference signal corresponding to the predetermined threshold.

8. The driver circuit of claim 1 wherein each of the first and second switches comprises a field effect transistor.

9. The driver circuit of claim 8 wherein the pulse width modulator is configured to generate a first pulse width modulated signal PWM1 coupled to a gate terminal of first field effect transistor switch, and a second pulse width modulated signal PWM2 coupled to a gate terminal of second field effect transistor switch, wherein the signals PWM1 and PWM2 are non-overlapping pulses.

10. The driver circuit of claim 9 wherein the pulse width modulator generates signal PWM1 at one of a rising or falling edge of the output signal of the VCO, and generates signal PWM2 at the other one of the rising or falling edge of the output signal of the VCO.

11. A method for driving an ultrasonic transducer, comprising:

(a) sweeping a transducer frequency profile to locate a peak load current;

(b) defining a reference frequency as the frequency corresponding to the peak current;

(c) adjusting an oscillation frequency of an oscillator to the reference frequency;

(d) controlling output transistor switches by pulse width modulated signals generated in response to the oscillator output to adjust transducer current; and (e) periodically repeating steps (a) through (d) to dynamically adjust the reference frequency that controls the transducer current.

12. The method of claim 11 wherein the step of sweeping the transducer frequency profile comprises an initial round of multiple frequency sweeps with increasing granularity.

13. The method of claim 12 wherein the step of sweeping the transducer frequency profile comprises:

- performing a first broad frequency sweep using a first frequency step to locate a first approximate peak frequency f1;
- performing a second medium frequency sweep using a second frequency step that is smaller than the first frequency step, the second medium frequency sweep being centered around frequency f1 and yielding a peak frequency f2; and
- performing a third fine frequency sweep using a third frequency step that is smaller than the second frequency step, the second third fine frequency sweep being centered around frequency f2 and yielding a peak frequency f3.

14. The method of claim 11 wherein the step of sweeping the transducer frequency profile comprises a mid-operation sweep centered around the reference frequency.

15. The method of claim 11 wherein the step of controlling output transistor switches comprises generating non-overlapping pulse-width modulated signals.

16. An ultrasonic system comprising:

an ultrasonic transducer; and a driver circuit coupled to the ultrasonic transducer, wherein the driver circuit comprises a microprocessor controlled phase-locked loop that is configured to periodically sweep a frequency profile of the transducer to locate and lock onto a resonance frequency, and to control a current of the transducer by pulse width modulated current switches, said microprocessor having software configured to execute functions including:

(a) sweeping a transducer frequency profile to locate a peak load current;

(b) defining a reference frequency as the frequency corresponding to the peak current;

(c) adjusting an oscillation frequency of an oscillator to the reference frequency;

(d) controlling output transistor switches by pulse width modulated signals generated in response to the oscillator output to adjust transducer current; and (e) periodically repeating steps (a) through (d) to dynamically adjust the reference frequency that controls the transducer current.

17. The ultrasonic system of claim 16 wherein the driver circuit comprises a current sensor magnetically coupled to the transducer and configured to detect transducer current.

18. The ultrasonic system of claim 17 wherein the driver circuit further comprises a voltage-controlled oscillator (VCO) coupled to the microprocessor and configured to generate an output signal oscillating at the resonance frequency in response to a control signal from the microprocessor.

19. The ultrasonic system of claim 18 wherein the driver circuit further comprises a pulse-width modulator coupled to the VCO and configured to generate non-overlapping pulse width modulated signals in response to the VCO output signal.

20. The ultrasonic system of claim 16 further comprising a container for receiving energy from the transducer, the container having a chamber for holding a liquid containing cells or viruses to be lysed, and the chamber having a least one wall providing an interface between the transducer and the contents of the chamber.

21. The ultrasonic system of claim 20 wherein the transducer is directly coupled to the chamber wall.

22. The ultrasonic system of claim 20 wherein the transducer is coupled to the chamber wall via a horn, the horn having a vibrating tip for deflecting the chamber wall.

23. The method of claim 11, wherein the transducer is driven to lyse cells or viruses held in a container by coupling the transducer to a wall of the container and sonicating the chamber.

24. The method of claim 23, wherein the transducer is coupled to the wall of the sample container via a horn.

25. The method of claim 23 wherein the transducer is directly coupled to the sample container.

* * * * *